United States Patent
Uchiyama

[19]

[11] Patent Number: 6,121,988
[45] Date of Patent: Sep. 19, 2000

[54] PRINTED WIRING BOARD AND ITS MANUFACTURING METHOD, AND ELECTRONIC APPARATUS

[75] Inventor: Kenji Uchiyama, Suwa, Japan

[73] Assignee: Seiko Epson Corporation, Tokyo, Japan

[21] Appl. No.: 08/809,801

[22] PCT Filed: Sep. 26, 1995

[86] PCT No.: PCT/JP95/01941

§ 371 Date: Mar. 27, 1997

§ 102(e) Date: Mar. 27, 1997

[87] PCT Pub. No.: WO96/10326

PCT Pub. Date: Apr. 4, 1996

[30] Foreign Application Priority Data

Sep. 27, 1994 [JP] Japan .................................. 6-231628

[51] Int. Cl.⁷ .................................................... H05K 1/02
[52] U.S. Cl. ............................ 347/208; 40/448; 174/260
[58] Field of Search ............................ 347/208; 174/256, 174/257, 258, 260; 40/448

[56] References Cited

U.S. PATENT DOCUMENTS

| | | |
|---|---|---|
| 2,910,628 | 10/1959 | Keener . |
| 3,221,286 | 11/1965 | Fedde . |
| 3,376,479 | 4/1968 | Wines et al. . |
| 3,716,846 | 2/1973 | Volckart et al. . |
| 3,780,430 | 12/1973 | Feeney . |
| 3,971,127 | 7/1976 | Giguere et al. . |
| 4,335,272 | 6/1982 | Pittenger ................................ 174/68.5 |

FOREIGN PATENT DOCUMENTS

| | | |
|---|---|---|
| U-53-8575 | 1/1978 | Japan . |
| U-53-64248 | 5/1978 | Japan . |
| B2-60-13274 | 4/1985 | Japan . |
| U-63-22764 | 2/1988 | Japan . |
| A-2-260598 | 10/1990 | Japan . |
| A-2-280395 | 11/1990 | Japan . |
| A-3-74892 | 3/1991 | Japan . |
| A-3-257985 | 11/1991 | Japan . |
| 4-22075 | 1/1992 | Japan . |
| 4-22187 | 1/1992 | Japan . |
| 4-93092 | 3/1992 | Japan . |
| A-4-112594 | 4/1992 | Japan . |
| 4-262590 | 9/1992 | Japan . |
| 5-275130 | 10/1993 | Japan . |
| 7-288041 | 10/1995 | Japan . |

*Primary Examiner*—Huan Tran
*Attorney, Agent, or Firm*—Oliff & Berridge, PLC

[57] ABSTRACT

A cutout portion 12 is formed by partially cutting out a board along a predetermined fold and a first portion 14 and a second portion 15 partitioned along the fold are folded and attached together into a unitary body by a bonding agent or thermal fusing. Formed on a surface of the printed wiring board 11 is a conductor pattern 17 that continuously runs across the fold at the cutout portion between the first portion and the second portion, and thus the conductor pattern assuring continuity between both sides of a printed wiring board 20 results without the need for providing throughholes. By employing such a printed wiring board, a compact and low-cost feature can be implemented into electronic apparatuses or portable information apparatuses, such as liquid crystal display devices or electronic printers, through a miniature, light-weight and flat design effort.

3 Claims, 20 Drawing Sheets

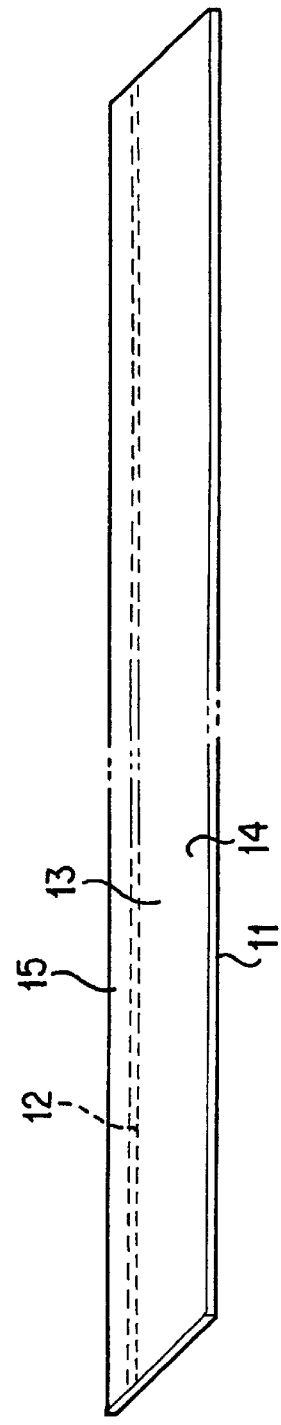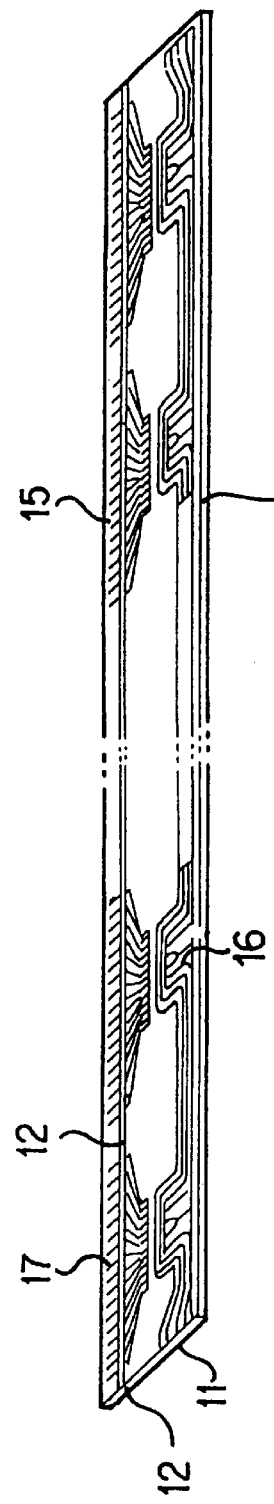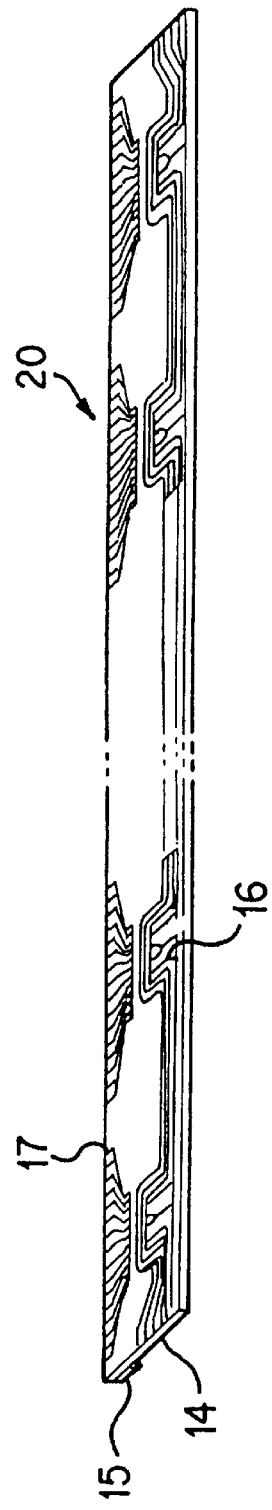

PRINTED WIRING BOARD AND ITS MANUFACTURING METHOD, AND ELECTRONIC APPARATUS

FIELD OF INVENTION

The present invention relates to a printed wiring board on which electronic parts including LSIs and discrete components such as resistors and diodes are mounted and to a method of manufacturing the printed wiring board. The present invention also relates to electronic apparatuses, such as LCD devices or electronic printer devices, which employ such a printed wiring board.

DESCRIPTION OF RELATED ART

Electronic apparatuses, regardless of whether they are portable or stationary, are used in a diversity of fields including OA (office automation) and information-related fields. There is a growing demand today for a high-performance and multi-functional design as well as a small, light-weight and flat design, i.e., a compact design, for electronic apparatuses. For this reason, a miniature, light-weight and flat design is also desirable for circuit boards and printed wiring boards that constitute a part of the circuit boards, which are housed in the electronic apparatuses. High density packaging is also desirable and miniaturization of electrodes, terminals and trace patterns accommodates high density packaging.

For example, as shown in FIGS. 25 and 26, the specification of Japanese Patent Application No. Hei-5-223623 describes a prior art printed wiring board for use in a liquid crystal display device (LCD). A printed wiring board 1 is constructed of an elongated insulating board 2 on which a plurality of liquid crystal driving semiconductor chips (not shown) are mounted. The elongated insulating board 2 is provided, on a semiconductor chip mounting side surface 3, with input terminals 4, input side patterns 5 and output side patterns 6. Output terminals 7 of the printed wiring board 1 are formed on a bottom side 8 opposite to the semiconductor chip mounting side surface 3 as shown in FIG. 26 and are connected to the output side patterns 6 via through-holes 9. The output terminals 7 are connected to LCD input terminals (not shown) of a liquid crystal display panel (not shown), for example, via an anisotropic conductive film.

Along with high density packaging of the circuit board, high density and fine pitch design in the layout of the electrodes, terminals and pattern traces are promoted accordingly, and a higher density of through-holes and smaller diameters of the through-holes are thus implemented. Since the through-holes are typically formed by pressing or drilling, a reduction in the diameter of the through-holes is limited. Thus, advancement of fine pitch design of the through-holes and pattern traces is accordingly limited. Presently, the diameter of the through-holes is typically 0.1 millimeters (mm) at a minimum, and the pattern layout pitch, even if the through-holes are arranged in a staggered configuration, is typically 0.2 μm at a minimum.

Fine pitch design of the through-holes may be improved even further if they are arranged in three rows, four rows or even more rows, but the board area required for forming the through-holes is expanded thereby resulting in the entire circuit board in becoming bulky. This fine pitch design conflicts with the more desirable miniature, light-weight and flat design. The smaller the diameter of the through-holes and the finer pitch of the through-holes are, the more difficult the drilling operation of the through-holes is. Also, the manufacturing cost of the printed wiring board is increased as a result of costs associated with broken drill bits and degraded production yield. Thus, the electronic apparatuses, such as liquid crystal display devices or electronic printer devices that have such a circuit board not only fail to meet the miniature, light-weight and flat design requirement but also results in a high manufacturing cost product.

OBJECTS OF THE INVENTION

It is an object of the present invention to provide a low-cost printed wiring board adapted for high density packaging and a manufacturing method therefor, wherein a miniature, light-weight and flat design is implemented while a fine-pitch design of electrodes, terminals and wiring pattern traces is used.

It is yet another object of the present invention to promote a compact construction by implementing a miniature, light-weight, and flat design into an electronic device such as a liquid crystal display device or an electronic printer device while reducing its manufacturing cost.

SUMMARY OF THE INVENTION

According to a first aspect of the present invention, a printed wiring board is constructed of an insulating board having a first portion and a second portion folded at a fold formed therebetween and stacked together. The insulating board includes a cutout portion that is formed by partially cutting out the insulating board along the fold and a conductor pattern that extends continuously across the fold at the cutout portion between the first portion and the second portion on an outside surface of the insulating board.

By forming the conductor pattern on the outside surface of the insulating board, wiring pattern traces are formed on both sides of the board, between which their continuity is assured. Also, a fine pitch design of the pattern traces and wiring is achieved. The printed wiring board is thus adaptable to high density packaging. Since no through-holes are required, the surface area of the circuit board is reduced, and a light-weight and flat design results.

In another embodiment, the insulating board includes a plurality of second portions, which are folded back over the first portion.

The cutout portion may extend over an entire length of the fold or extend over only a part of the fold where the conductor pattern is formed. The cutout portion may be shaped to be a series of small holes, slits or grooves. The cutout portion may be formed by cutting through insulating board or may be formed of grooves with the surface sides having the conductor pattern partially remaining thereon.

The insulating board material for the printed wiring board of the present invention is preferably a composite material containing glass fiber, aramid fiber or a combination of glass fiber and aramid fiber and epoxy resin, polyimide resin, BT (bismaleimide triazine) resin or other similar materials, or a single material, a mixture of materials, a combination of materials selected from epoxy-based resin, polyimide-based resin, BT based resin, polyester-based resin and the like.

In another embodiment, the present invention provides a multi-layered printed wiring board that comprises a pair of outer layer boards made of insulating material, a single inner layer or multiple inner layer boards made of insulating material sandwiched between the outer layer boards, and conductor patterns formed between the outer layer boards and inner layer boards. One of the outer layer boards has a first portion that is attached onto the inner layer board next to one of the outer layer boards and a second portion that is folded along a fold back over the other outer layer board. One of the outer layer boards has a cutout portion that is formed by partially cutting out the insulating material along the fold. A conductor pattern is formed that extends continuously across the fold at the cutout portion between the first portion and the second portion.

In a second aspect, the present invention provides a method of manufacturing a printed wiring board that comprises the steps of forming a cutout portion by partially cutting out the insulating board material along the fold that partitions the insulating board into a first portion and a second portion; forming and then patterning a conductive film on an outer surface of the insulating board to form a conductor pattern that extends continuously across the fold at the cutout portion between the first portion and the second portion; and folding the insulating board along the fold with the conductor pattern extending outwardly, so that the first portion and the second portion are mutually stacked. Thus, the printed wiring board is manufactured relatively easily and the cutout portion is easily formed by pressing or drilling the insulating board.

In yet another embodiment, the present invention provides a method of manufacturing a printed wiring board that comprises the steps of forming and then patterning a conductive film on a surface of an insulating board that is partitioned along a fold into a first portion and a second portion; forming a conductor pattern that extends continuously across the fold between the first portion and the second portion; forming a cutout portion by partially cutting out the insulating board along the fold at least within an area where the conductor pattern is formed; folding the insulating board along the fold with its conductor pattern extending outwardly so that the first portion and the second portion are mutually stacked. In this arrangement, the cutout portion is conveniently formed by directing an excimer laser beam to physiochemically cut out the insulating board.

In yet another embodiment, the present invention provides a method of manufacturing a printed wiring board that comprises the steps of forming a conductive film on the surface of an insulating board that is partitioned along a fold into a first portion and a second portion; forming a cutout portion by partially cutting out the insulating board along the fold; patterning the conductive film to form a conductor pattern that extends continuously across the fold at the cutout portion between the first portion and the second portion; folding the insulating board along the fold with the conductor pattern extending outwardly so that the first portion and the second portion are mutually stacked. In this arrangement, the stacked first portion and the second portion may be connected into a unitary body by a bonding agent or thermal fusing.

According to a third aspect, the present invention provides an electronic apparatus that employs a circuit board constructed of a printed wiring board on which electronic components are mounted. In such an electronic apparatus, a compact construction through a miniature, light-weight and flat design is promoted by using a miniature, light-weight and flat printed wiring board. For example, by mounting a liquid crystal driving semiconductor chip on the printed wiring board of the present invention, and by connecting this assembly to a liquid crystal display panel, a miniature, light-weight and flat liquid crystal display device results. In a portable electronic apparatus that particularly needs a compact structure, an entire apparatus may be constructed in a miniature, light-weight and flat construction, while its screen size may be enlarged compared to prior art apparatuses to assure good visibility and an increased quantity of on-screen information, thereby promoting high performance and multi-functional characteristics of the electronic apparatus. By integrating a touch panel as an input device for liquid crystal display, a miniature, light-weight and flat input/output device results. By mounting a driving semiconductor chip on the printed wiring board of the present invention, and by connecting this assembly to a thermal printer head, a miniature, light-weight and flatly designed electronic printer apparatus results.

BRIEF DESCRIPTION OF THE DRAWINGS

FIGS. 1A–1C are perspective views showing a method of manufacturing a printed wiring board according to the present invention in a sequential order of manufacturing steps;

DESCRIPTION OF PREFERRED EMBODIMENTS

Figure 2A:
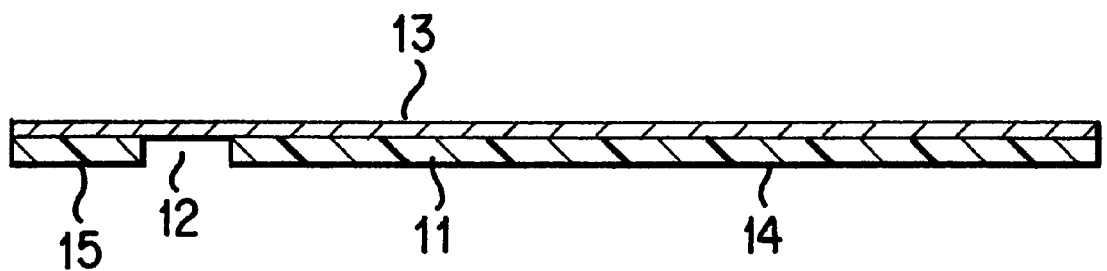
FIGS. 2A–2C are corresponding cross-sectional views of the printed wiring board of the present invention.

Shown in FIGS. 1A–1C and 2A–2C is a method of manufacturing a printed wiring board in a sequential order of manufacturing steps according to the present invention. The printed wiring board herein functions as a driving circuit board for a liquid crystal display device. Mounted on the printer wiring board are a plurality of liquid crystal driving semiconductor chips. In this embodiment, an ordinary, relatively hard, elongated, polyimide-resin-based insulating board 11 having a thickness of approximately 25 μm is employed. First, a cutout portion 12 is formed and comprises a plurality of consecutive slits made along a predetermined fold line extending in parallel with at least one of two lengthwise sides of the insulating board 11. The width of each slit is preferably two to four times the thickness of the insulating board 11. The cutout portion 12 is physically formed using conventional mechanical means such as die pressing or drilling. A conductive film 13 such as an electrolytic copper film having a thickness of approximately 18 μm is applied on a top surface of the insulating board 11 (FIG. 1A, FIG. 2A). The insulating board 11 is partitioned by a fold formed at the cutout portion 12 into a first portion 14 and a second portion 15.

Figure 2B:
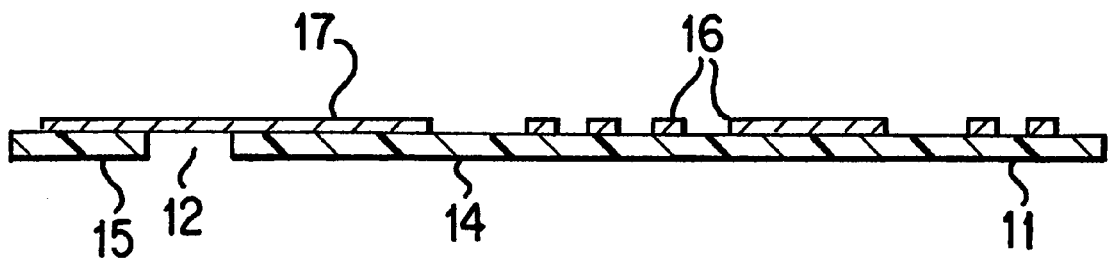

Next, the conductive film 13 is etched using a prior art technique such as photo-etching to form desired input and output conductor patterns 16, 17. Respective surfaces of the conductor patterns are coated with Ni—Au plating to mitigate problems such as migration. As shown in FIGS. 1B and 2B, the input conductor pattern 16 of each semiconductor chip is formed on the top surface of the first portion 14 of the insulating board 11, and the output conductor pattern 17 is formed on both of the first portion 14 and the second portion 15 of the insulating board 11, to extend continuously across the fold at the cutout portion 12.

Next, the insulating board 11 is folded along the fold with the output conductor pattern 17 exposed outwardly, and the second portion 15 is folded back and stacked onto a bottom side 18 of the first portion 14. As already described, since only copper foil constituting the conductor pattern 17 exists at the cutout portion 12, the insulating board 11 is easily folded. The first portion 14 and the stacked second portion 15 are bonded into a unitary body by thermo-compression bonding using an appropriate bonding agent consisting of a single material, a mixture of materials or a combination of materials selected from epoxy-based resin, urethane-based resin, polyester-based resin, acrylic-based resin and the like to form a printed wiring board 20 of the present invention. An output terminal 19 of the output conductor pattern 17 is formed on the second portion 15 and is connected to an input terminal of a liquid crystal panel.

Figure 2C:
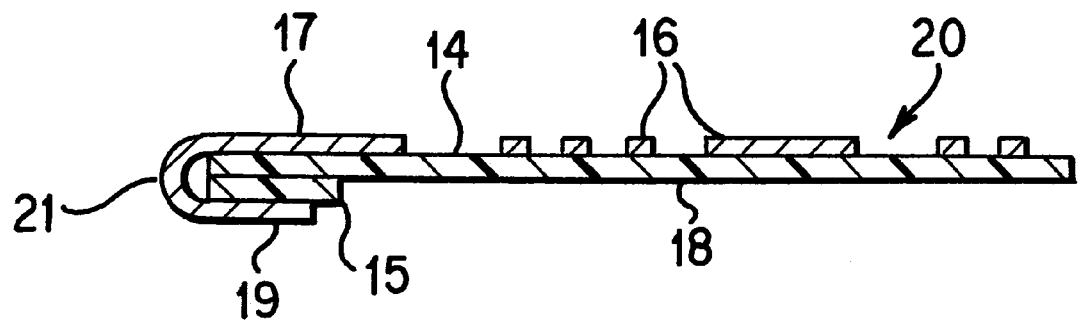

The printed wiring board 20 of the present invention having the conductor or wiring patterns on both sides as shown in FIGS. 1C and 2C is manufactured in this manner. Since the cutout portion 12 allows a bent portion 21 of the conductor pattern 17 to be curved as shown in FIG. 2C, the bent portion 21 cannot be broken easily during the bending operation of the insulating board 11 or after the printed wiring board 20 is manufactured.

The thickness of the insulating board 11 is not limited to 25 μm, and is preferably within a range of 10 μm–0.2 μm. In addition to polyimide-based resin as the material of the insulating board, a single material or a composite material selected from epoxy-based resin, polyimide-based resin, BT (bismaleimide triazine) resin and the like may be used, or a composite material of glass fiber, aramid fiber or a mixture of glass fiber and aramid fiber and epoxy-based resin, polyimide-based resin, BT resin or the like may be used.

The thickness of the electrolytic copper foil for the conductive film 13 is preferably within a range of 5 μm–50 μm. Besides electrolytic copper foil, other acceptable material for the conductive film 13 are rolled copper foil, alloy copper foil such as phosphor bronze foil, aluminum foil, gold foil, or metal film formed by subjecting gold, aluminum, copper, tin, zinc, nickel, chrome and the like, individually or in combination for deposition, sputtering or other process.

Besides Au—Ni plating, the surface of the conductor patterns 16, 17 may be coated with the plating of tin, solder, zinc, aluminum, chrome, nickel, gold, silver, copper and the like or any selected combination thereof. The surface of the conductor patterns may be coated with the metal plating even after the second portion 15 is folded as shown in FIGS. 1C and 2C. The thickness of the metal plating is preferably within a range of 0.1 μm–5 μm. The surface of the conductor pattern, even if it does not undergo the above described plating process, does not affect the present invention.

Figure 3A:
FIGS. 3A–3D are plan views showing cutout portions having different shapes formed on respective insulating boards.
Figure 3B:
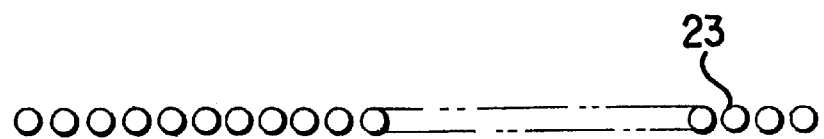
Figure 3C:
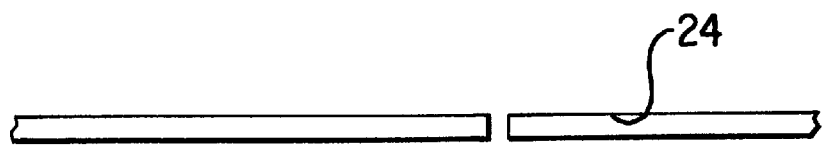
Figure 3D:

In this embodiment, the cutout portion 12 is formed of consecutive slits 22 as shown in FIG. 3A and, in another embodiment, the cutout portion 12 is formed of consecutive small holes 23 as shown in FIG. 3B. Furthermore, in yet another embodiment, a groove 24 is formed within an area where the conductor pattern runs between the first portion and the second portion of the insulating board and, in this case, a part of the insulating board where no conductor pattern runs is thin enough to be folded. Furthermore, as shown in FIG. 3D, a groove 25 may be formed over the entire length of the fold. The shape of the cutout portion 12 is not limited to any of the shapes in FIGS. 3A–3D, and may be formed in a diversity of shapes.

According to the present invention, the conductor patterns are formed on both surfaces of the printed wiring board with electric continuity allowed therebetween using conventional techniques art rather than using special tools, devices and facilities. Since the conductor patterns are directly connected without any need for through-holes, a finer wiring and a finer wiring pitch are achieved. Since the board area required for the through-holes is eliminated and the output conductor pattern is folded and stacked, the entire board area is even further reduced while a light-weight, flat design is simultaneously achieved.

Figure 4:
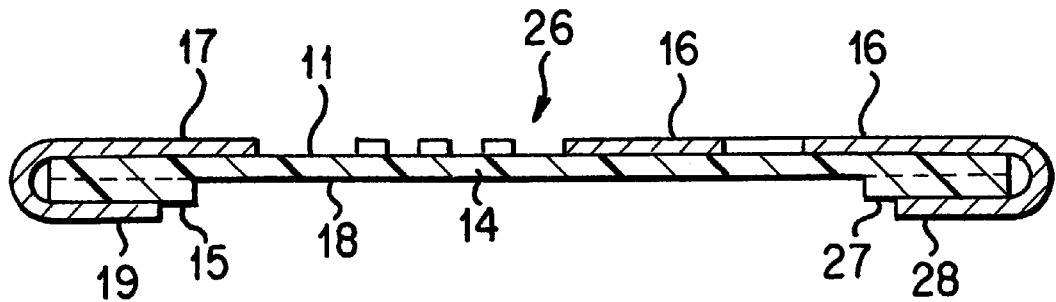
FIG. 4 is a cross-sectional view showing an alternate embodiment of the printed wiring board of the present invention.

A printed wiring board 26 of an alternative embodiment of the present invention is shown in FIG. 4 and has a second portion 27 on an input side of the insulating board 11. The printed wiring board 26 is folded with the conductor pattern 16 exposed outwardly along the fold at a cutout portion formed in the same way the second portion 15 on the output side is cut out. The second portion 27 is stacked on the bottom side 18 of the first portion 14. In this arrangement, the input side is also provided with the conductor pattern that extends continuously between both sides of the printed wiring board. By folding and stacking the conductor pattern formed on the second portion 27 which is used as an input terminal 28, the input conductor pattern 16 is designed to be finer in the same way the output conductor pattern 17 is designed to be finer, and the printed wiring board is therefore designed to be even more compact.

Figure 5:
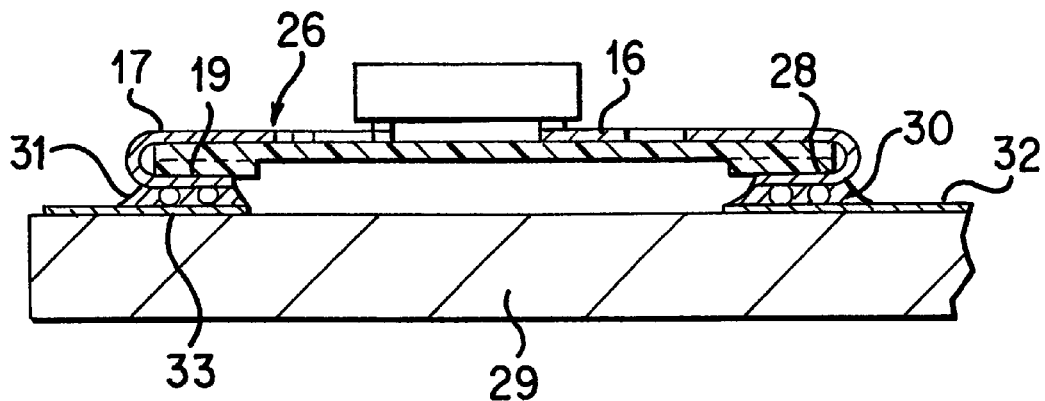
FIG. 5 is a cross-sectional view of the printed wiring board of FIG. 4 shown with components mounted thereon.

The printed wiring board 26 in FIG. 4 is mounted onto a main unit board 29 of an electronic apparatus as shown in FIG. 5. The input terminal 28 and the output terminal 19 are respectively connected to wirings 32, 33 on the main unit board 29 via anisotropic conductive films 30, 31.

Figure 6:
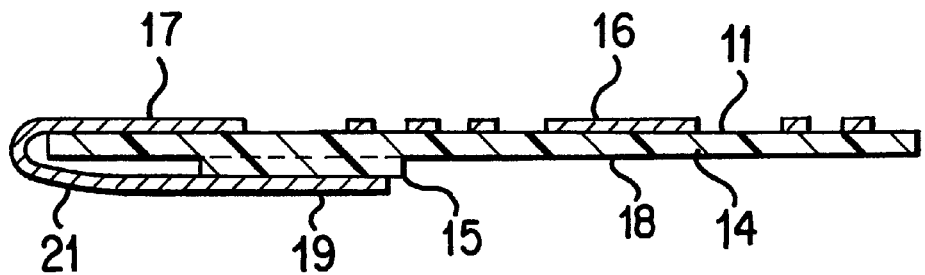
FIG. 6 is a cross-sectional view showing another embodiment of the printed wiring board of the present invention.

In yet another embodiment of the present invention shown in FIG. 6, a width of the cutout portion 12 is substantially widened so that the second portion 15 is stacked at a location further into a center of the bottom side 18 of the first portion 14. In this arrangement, the output terminal 19 is bonded to an optimum location that matches the terminal position and structure of a unit to which it is to be mated. In this case, silicon resin, acrylic resin or urethane resin may be molded around the bent portion 21 to seal it against moisture, dirt and mechanical contact.

Figure 7A:
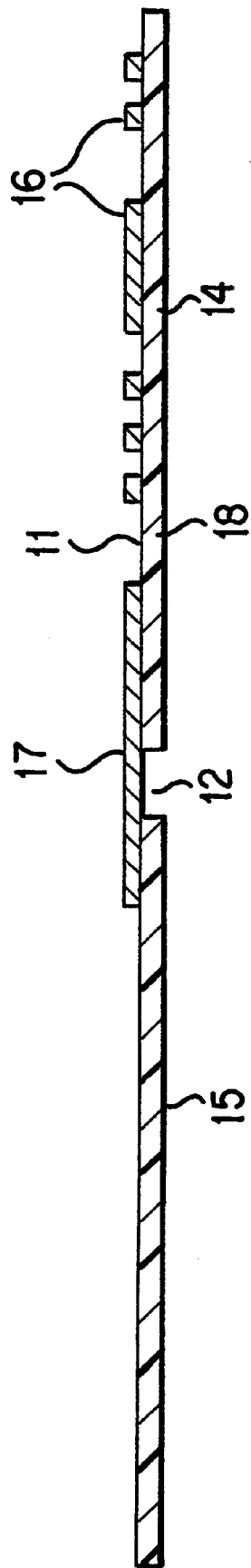
FIGS. 7A–7B are cross-sectional views showing yet another embodiment of the printed wiring board of the present invention.
Figure 7B:
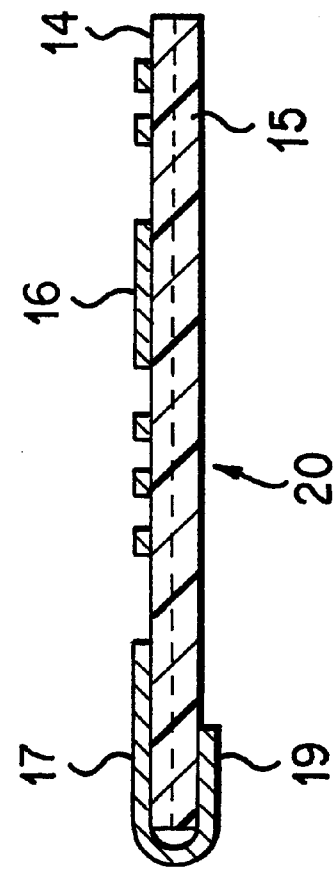

In the embodiment shown in FIGS. 7A and 7B, the insulating board 11 is partitioned into the first portion 14 and the second portion 15, both portions being identical in dimensions and shape. By connecting the first portion 14 and the second portion 15 together, the resultant printed wiring board has a substantially uniform thickness throughout its overall area. When semiconductor chips and the like are mounted on the input conductor pattern and output conductor pattern 16, 17 on the first portion 14 in a face down fashion, uniform bonding and high reliably are assured with no influence of variations in the thickness of the insulating board. The entire printed wiring board is less susceptible to thermal deformation, and is capable of maintaining its shape reliably. Furthermore, when the printed wiring board is manufactured, the first portion 14 and the second portion 15 are easily aligned with each other. Thus, accuracy is enhanced, yield is improved, and manufacturing cost is reduced.

In yet another embodiment, the B staged resin (a resin at its middle stage before it fully reacts to be a resin) of a single material or a composite material selected from epoxy-based resin, polyimide-based resin, BT resin and the like, or a composite material made of glass fiber, aramid fiber, a mixture of glass fiber and aramid fiber and the B staged resin of epoxy-based resin, polyimide-based resin, BT resin or the like are used as the material for the insulating board 11. In this case, the folded first portion 14 and second portion 15 are attached as a unitary body by means of heat fusion rather than using a bonding agent. This arrangement allows the printed wiring board 20 to be thin, and thus the printed wiring board 20 makes a dimensionally reliable printed wiring board that is highly heat-resistant and insusceptible to heat deformation.

Figure 8A:
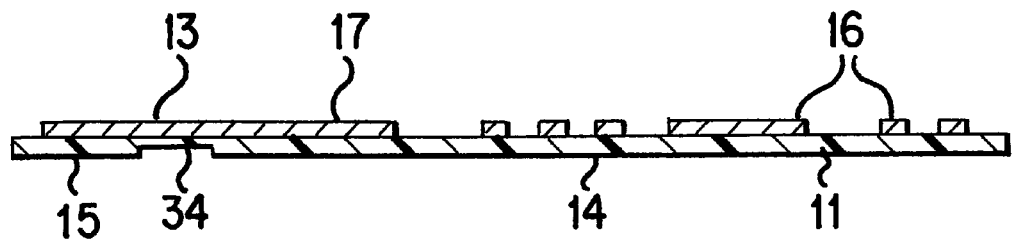
FIGS. 8A–8B are cross-sectional views showing yet another embodiment of the printed wiring board of the present invention.
Figure 8B:
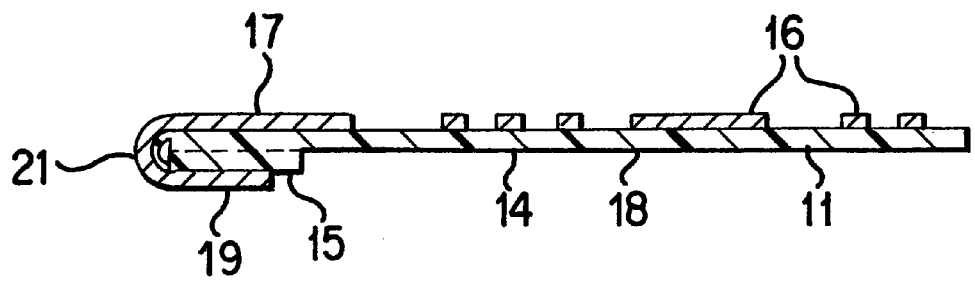

In the embodiment shown in FIGS. 8A and 8B, a cutout portion 12 is formed as a recess whereby a part of the thickness of the insulating board 11 is left uncut. In this embodiment, the insulating board 11 of polyimide resin having a thickness of 18 $\mu$m is employed, and the cutout portion 24 is formed with a thickness of 9 $\mu$m of the board material left uncut. Such a cutout portion may be formed by cutting the insulating board by abrasion, chemical etching or an excimer laser beam. In this embodiment, the conductive film 13 having a thickness of 0.5 $\mu$m is formed on the insulating board 11 by depositing copper on the surface of the insulating board 11, then the insulating board 11 with the conductive film 13 is patterned by etching or other similar technique, and a plating process is performed to form the conductor patterns 16, 17 having a thickness of approximately 5 $\mu$m.

According to this embodiment, as shown in FIG. 8B, the insulating board 11 is easily folded, because a residual portion of the board material at the bent portion 21 is thin and, since the residual portion of the board material reinforces the conductor pattern 17, problems such as breakage are unlikely to take place. Thus, a highly reliable printed wiring board results. This arrangement allows the thickness of the conductive film 13 to be thinner. A finer wiring pattern and a finer wiring pitch thus result. In this embodiment, copper is deposited as the conductive film 13, and then the conductive film 13 is subjected to a plating process, which increases the film thickness to 5 $\mu$m. The conductive film is acceptable as long as it is within a thickness range of 5 $\mu$m–50 $\mu$m. A diversity of metal films already described with reference to the previous embodiments may be used as the conductive film.

Figure 9:
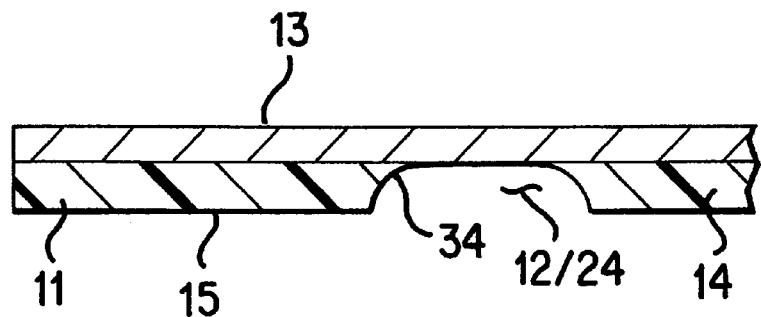
FIG. 9 is a cross-sectional view showing another cutout portion formed in the printed wiring board according to the present invention.

As shown in FIG. 9, the cutout portion 12 is the groove 24 which is formed by cutting the board material with its first and second portions remaining on the side of wiring conductor 17 and the cutout portion 12 or groove 24 has slanted side walls as viewed in cross-section.

Figure 10A:
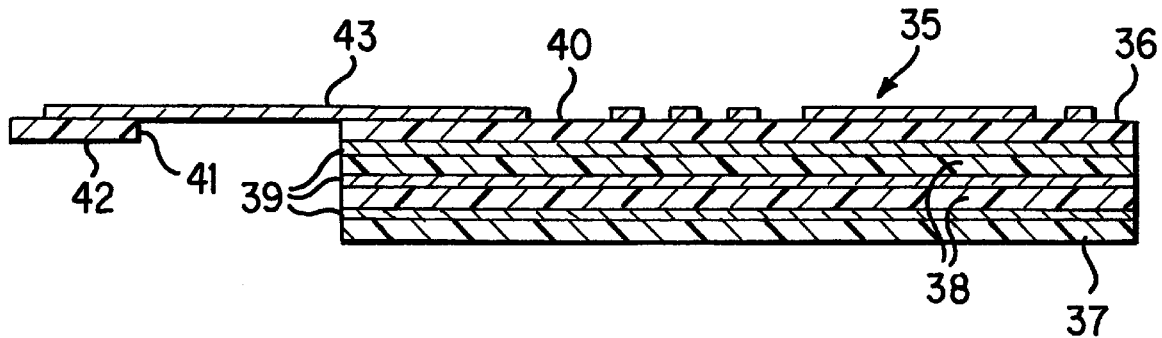
FIGS. 10A–10B are cross-sectional views showing a printed wiring board of multi-layered construction of the present invention.
Figure 10B:
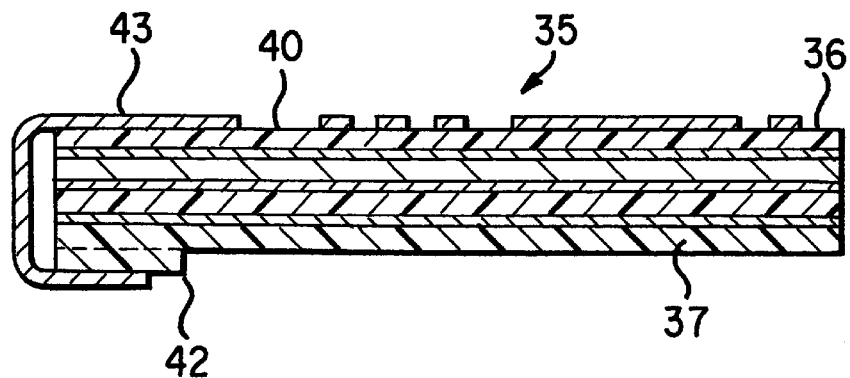

FIGS. 10A and 10B show an embodiment of a multi-layered printed wiring board 35 of the present invention. As shown in FIG. 10A, the multi-layered printed wiring board 35 comprises a pair of outer-layer boards 36, 37, two inner-layer boards 38, and three layers of conductor patterns 39 sandwiched therebetween. The top outer-layer 36 comprises a first portion 40 which is identical to the other outer-layer board 37 and the inner-layer boards 38 in dimension and shape, and which is attached onto the inner-layer board 38 immediately beneath it, and a second portion 42 that is separated from the first portion 40 by a cutout portion 41 that is formed in a wide width along a fold therebetween. Formed on the surface of the outer-layer board 36 is a conductor pattern 43 that extends continuously across the cutout portion 41 between the first portion 40 and the second portion 42.

In the same manner as in each of the preceding embodiments, the second portion 42 is folded until it is stacked over the other outer-layer board 37 with the conductor pattern 43 exposed outwardly. As shown in FIG. 10B, the multi-layered printed wiring board 35 of a five-layered construction includes the conductor pattern formed on the top surface that can be directly connected to the conductor pattern formed on the bottom surface. According to this embodiment, a finer conductor pattern and a finer pitch of the conductor pattern are achieved in the printed wiring board having multi-layered construction with less through-holes. Thus, a miniature, light-weight, and flat printed wiring board results, thereby improving yield and reducing manufacturing cost.

Figure 11A:
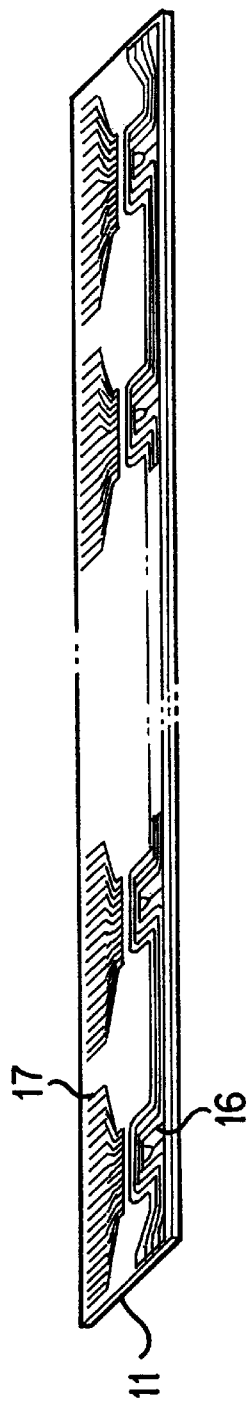
Figs. 11A–11C are perspective views showing a method of manufacturing the printed wiring board according to yet another embodiment of the present invention in a sequential order of manufacturing steps.
Figure 11B:
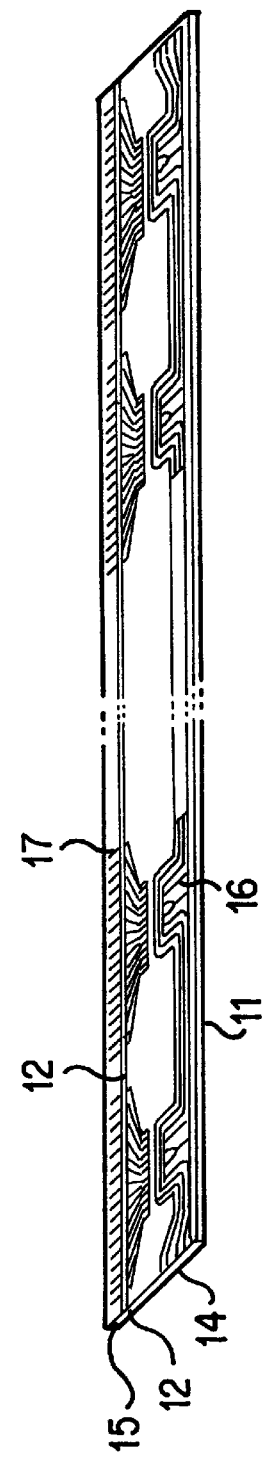
Figure 11C:
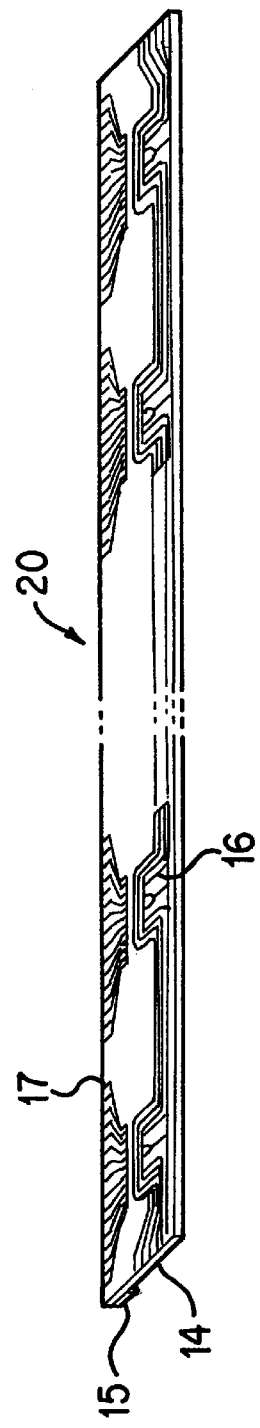
Figure 12A:
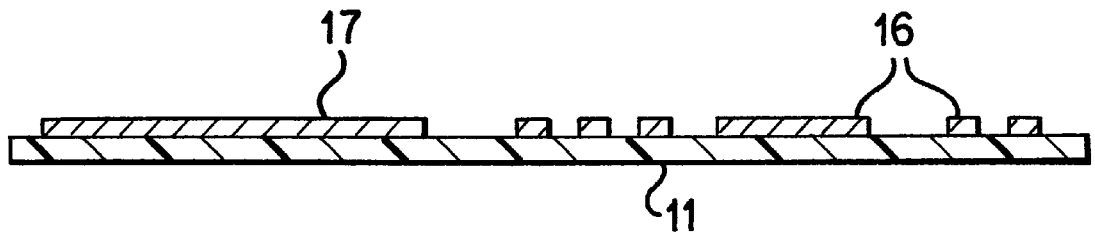
FIGS. 12A–12C are corresponding cross-sectional views of the printed wiring board shown in FIGS. 11a–11c.

Shown in FIGS. 11A–C and FIGS. 12A–C is the second embodiment of the manufacturing method of the printed wiring board according to the present invention in order of the manufacturing steps. In this embodiment, the insulating board is prepared first. The insulating board 11 is made of a polyimide-based resin having a top thickness of 25 $\mu$m. A conductive film made of electrolytic copper foil or the like having a thickness of 18 $\mu$m is applied as in the first embodiment. The conductive film is patterned using conventional techniques such as photoetching to form desired wiring patterns 16, 17 (FIG. 11A and FIG. 12A).

Figure 12B:
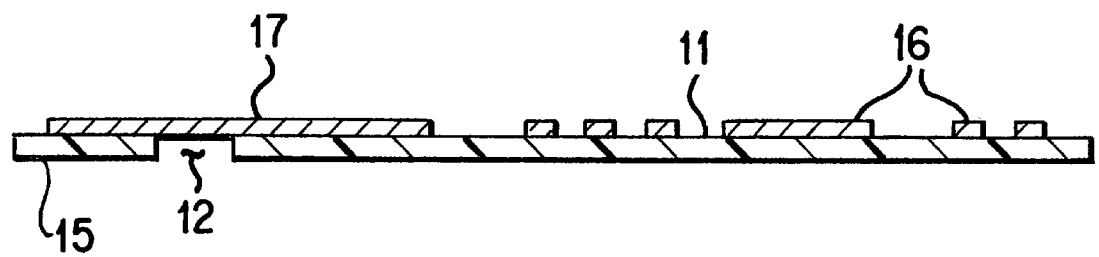
Figure 12C:
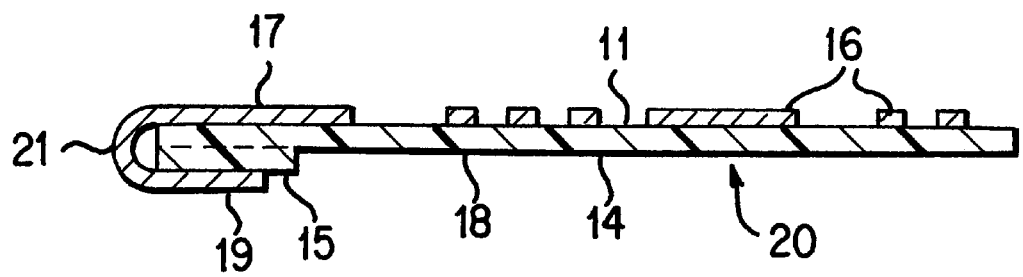

By directing an excimer laser beam to the insulating board 11 from its bottom side, the board material is cut along the predetermined fold physiochemically (abrasion) to form a cutout portion 12 made of a series of numerous slits (FIG. 11B and FIG. 12B). The cutout portion may be any of a variety of shapes described with reference to the first embodiment as shown in FIG. 3. In yet another embodiment, as previously described with reference to FIG. 8, the cutout portion 12 may be constructed of a recess where part of the thickness of the board material remaining on the wiring pattern side is left uncut. The insulating board 11 is folded with the wiring pattern 17 exposed outwardly so that the second portion 15 is attached onto the bottom side 18 of the first portion 14. The first portion 14 and the second portion 15 are bonded into a unitary body by thermo-compression using a bonding agent in the same manner as in the first embodiment.

In this embodiment, by using the excimer laser, the cutout portion 12 is formed finely with a high accuracy. Since, unlike the first embodiment, jigs or tools such as pressing dies or drills are not required, work is simplified and manufacturing cost is reduced.

In yet another embodiment of the manufacturing method of the printed wiring board 20 according to the present invention, the cutout portion is formed by directing the excimer laser to the insulating board 11, onto which the conductive film 13 is bonded, from the bottom side of the insulating board 11. Then, the conductive film is patterned to form the conductor pattern that extends across the cutout portion between the first portion and the second portion.

The printed wiring board of the present invention can be applied in a variety of electronic apparatuses as will be exemplified below. However, the present invention is not limited to these electronic apparatuses.

Figure 13:
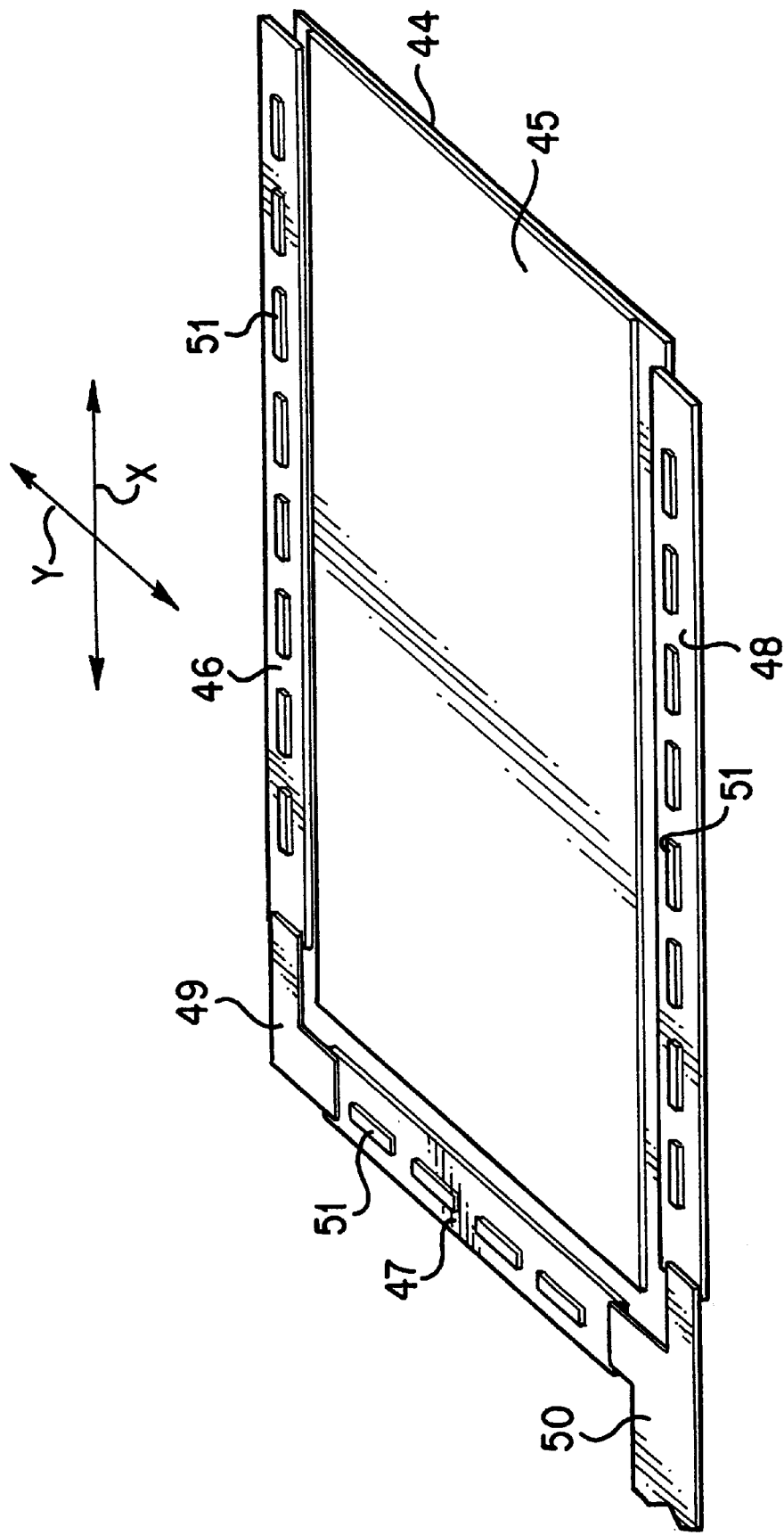
FIG. 13 is a perspective view of a first embodiment of a liquid crystal display device into which the present invention is embodied.
Figure 14:
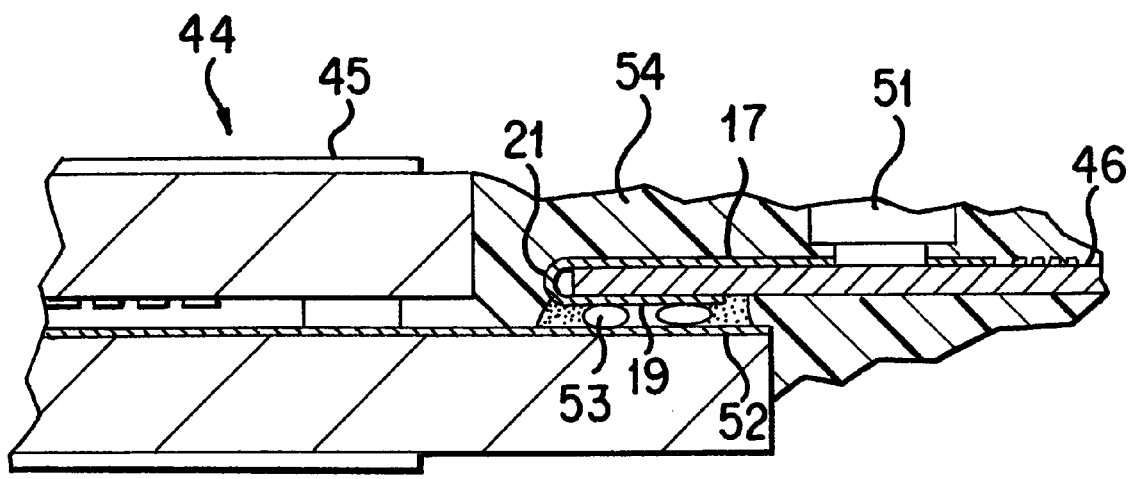
FIG. 14 is an enlarged, cross-sectional view showing a major portion of the device shown in FIG. 13.

FIG. 13 and FIG. 14 show a liquid crystal display device 44 into which the present invention is embodied. The liquid crystal display device 44 comprises a liquid crystal panel 45 (typically having a display size of 640×480 dots) having an ordinary XY matrix electrode structure, which has elongated planar circuit boards 46–48 around its periphery, respectively on its top edge, left-hand side edge and bottom edge as shown in FIG. 13. The circuit board 46 and the circuit board 47 are connected via an extension board 49, and the circuit board 47 and the circuit board 48 are connected via an extension board 50 with which a cable for external connection is integrated.

As best shown in FIG. 14, in the same way as the embodiment of the printed wiring board shown in FIG. 7B, each of the circuit boards is constructed of a printed wiring board of the present invention wherein a first portion and a second portion of identical dimensions and shape are bonded to make a substantially uniform thickness of the insulating board and a liquid crystal driving semiconductor chip 51 is mounted on the printed wiring board. The semiconductor chip 51 is connected via a commonly available anisotropic conductive film. In this embodiment, the semiconductor chip 51 is thermo-compression bonded using an anisotropic conductive film, which is made of both conductive particles that are formed of polystyrene particles with particle diameters of 5 μm with Ni—Au plating applied thereto and a bonding agent containing epoxy-based bonding agent as a major constituent. The conductive film is applied under a temperature of 180° C. and a pressure of 10 gf/bump for a pressure-application duration of 30 seconds. To bond the semiconductor chip 14, a variety of known techniques may be used, for example, by a flip chip bonding process in which solder bumps are directly face-down bonded or by another bonding process in which bumps of the semiconductor chip are directly bonded.

The output side of the liquid crystal driving semiconductor chip 51 is connected to the output terminal 19 on the bottom side via the conductor pattern 17 around the bent portion 21. The output terminal 19 is electrically and mechanically connected, via the anisotropic conductive film 53, to an LCD terminal 52 formed on the periphery of the liquid crystal panel 45. In this embodiment, the anisotropic conductive layer 53 is made up of both conductive particles that are formed by coating polystyrene particles having a particle diameter of 10 μm with Ni—Au plating and a bonding agent containing epoxy-based bonding agent as its major constituent. The anisotropic conductive layer 53 is bonded under the thermo-compression bonding conditions of a temperature of 170° C. and a pressure of 10 Mega-Pascal for a pressure-application duration of 20 seconds.

In yet another embodiment, only a bonding agent instead of the anisotropic conductive film is used to cause the output terminal 19 of the circuit board 46 to be in direct contact with the LCD terminal 52 for connection. In such a bonding method, the possibility of a short circuit arising from the use of the anisotropic conductive film is precluded. Thus, finer pitch wiring is achieved. In the same way, the circuit boards are connected to the extension boards 49, 50 via the anisotropic conductive film. In this embodiment, the anisotropic conductive film is made of nickel metal particles having a particle diameter of 5 μm and a bonding agent containing epoxy-based bonding agent as its major constituent. The anisotropic conductive film is thermo-compression bonded under the conditions of a temperature of 170° C. and a pressure of 3 Mega-Pascal for a pressure-application duration of 20 seconds.

A resin 54 such as a silicon resin, acrylic resin or urethane resin are molded around the circuit boards 46–48, the joint portion between the liquid crystal driving semiconductor chip 51 and the liquid crystal panel 45, and the joint portions of the extension boards 49, 50, respectively, to keep out moisture and dirt and to seal these respective components against mechanical contact for damage prevention.

According to this embodiment, since the circuit boards 46–48 are kept within the thickness of the liquid crystal panel 45 and the area of each circuit board that projects outwardly in a plane of the liquid crystal panel 45 is narrowed, the periphery portion of the liquid crystal panel 45 is reduced, thereby promoting a compact structure of the liquid crystal display device 44 as a miniature, light-weight and flat configuration. Since the manufacturing cost of the circuit board is reduced and the number of joints with the liquid crystal panel and joints between the circuit boards is also reduced, the cost for mounting and the cost for manufacturing the liquid crystal display device are reduced.

Figure 15:
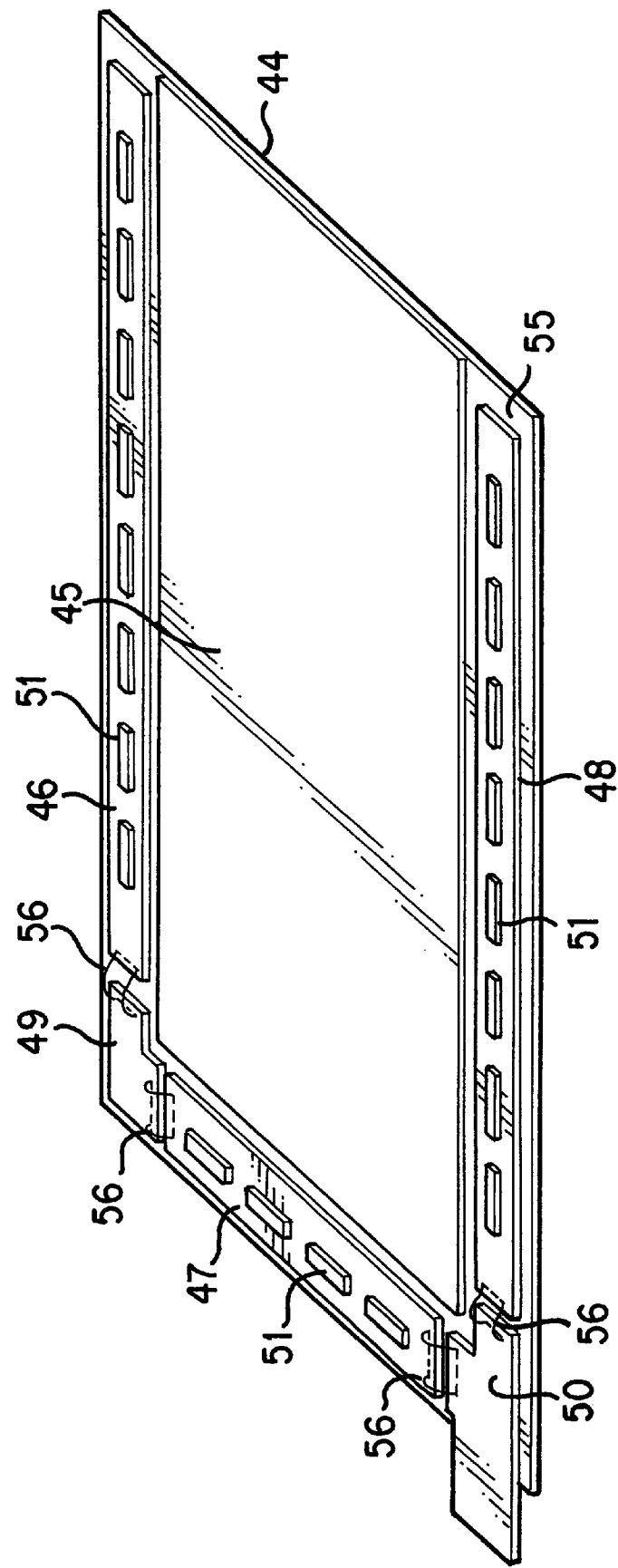
FIG. 15 is a perspective view of a second embodiment of the liquid crystal display device.
Figure 16:
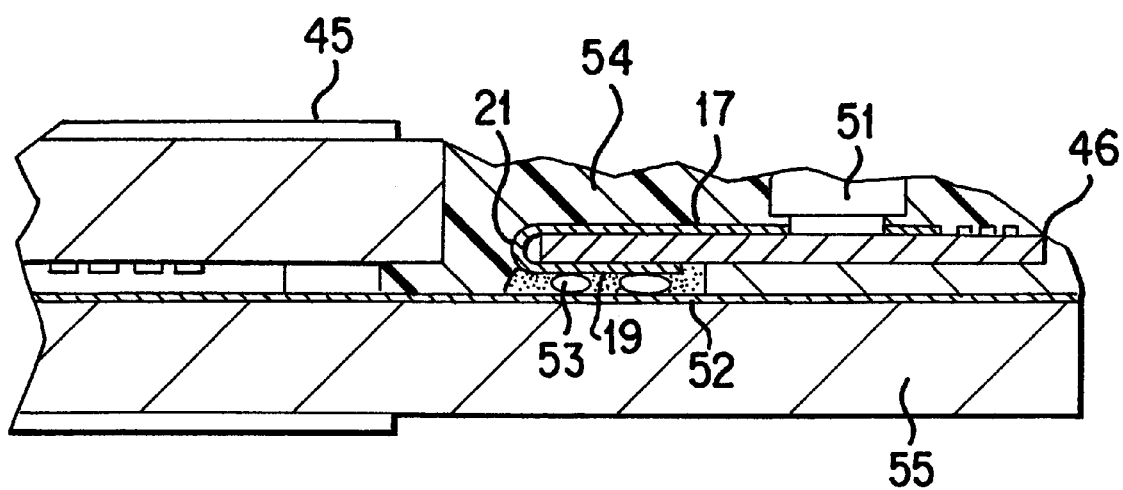
FIG. 16 is an enlarged, cross-sectional view showing a major portion of the device shown in FIG. 15.

FIG. 15 and FIG. 16 show an alternate example of the above-described liquid crystal display device. This embodiment is different from the first embodiment in FIG. 13 and FIG. 14 in that a periphery portion 55 of the liquid crystal panel 45 is enlarged so that the circuit boards 46–48 lie entirely within a plane defined by the periphery portion 55. Further, instead of the anisotropic conductive film, wires 56 constructed of a metal such as Au, Al or Cu or an alloy made of these metals are wire-bonded to connect the circuit boards to the respective extension boards 49, 50. In this embodiment, in addition to the advantage of the first embodiment, the circuit boards 46–48 are supported on their planar surface areas by the periphery portion 55 of the liquid crystal panel 45. Thus, the circuit boards are reinforced against vibrations and shocks, and a highly reliable liquid crystal display device 44 results.

Figure 17:
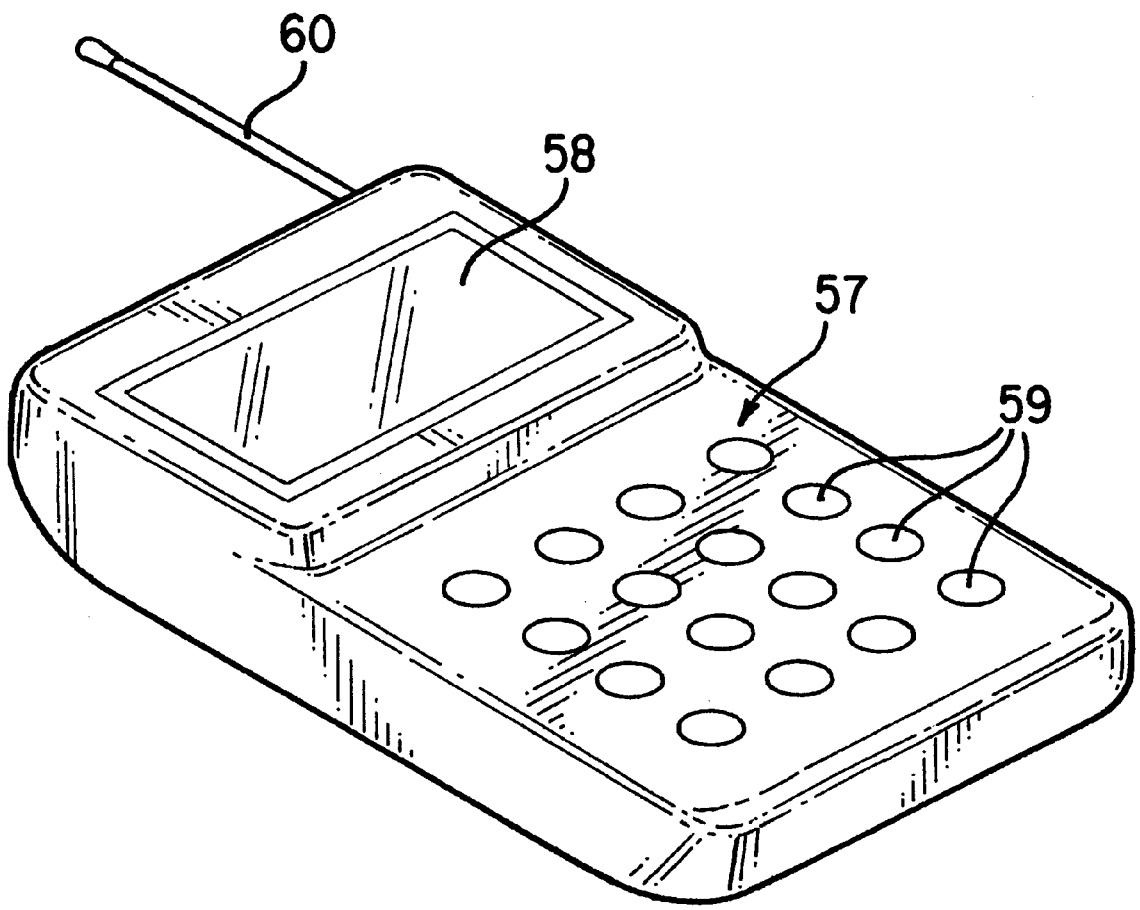
FIG. 17 is a perspective view of a portable information apparatus into which the present invention is embodied.

The liquid crystal display device of the present invention described above may be assembled into a portable information apparatus 57 to be used as a display 58 as shown in FIG. 17. The portable information apparatus 57 has a function that allows information to be bilaterally exchanged through a communications antenna 60 by entering data with a plurality of keys 59 on the portable information apparatus from indoors, outdoors or even in an operating electric car or an operating automobile. As described above, since the liquid crystal display device 44 of the present invention has a miniature, light-weight and flat construction, the periphery portion is reduced, and the display area is accordingly enlarged for better visibility. The portable information apparatus 57 that employs the liquid crystal display device makes a compact apparatus through a miniature, light-weight and flat configuration. Also, it is easy to carry and handle. Further, it offers an improved operability to the extent that it permits a single-handed operation, increases the quantity of on-screen information to be displayed, and presents high-performance and multi-functional features.

Figure 18:
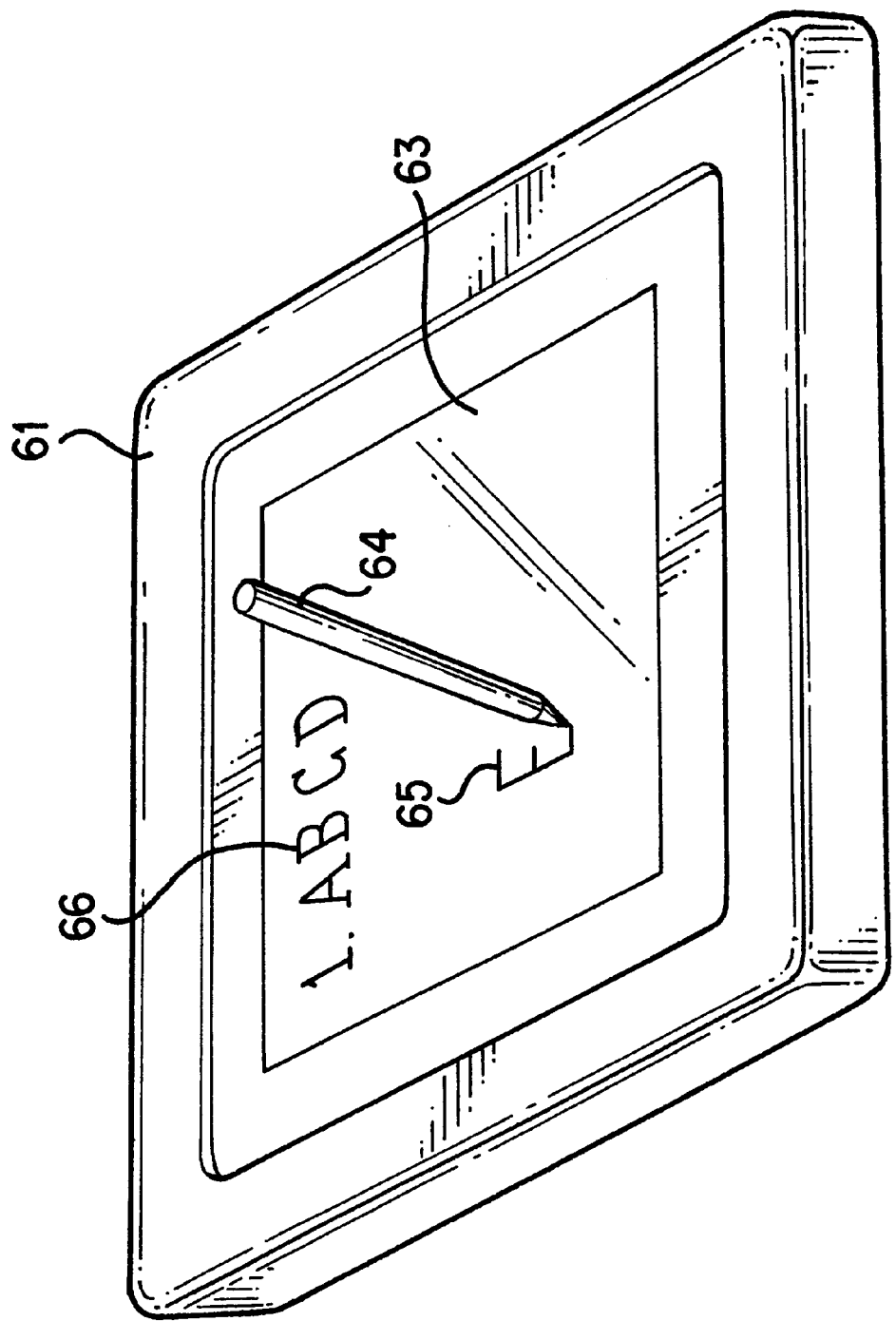
FIG. 18 is a perspective view showing an electronic apparatus having an input/output device into which the present invention is embodied.
Figure 19:
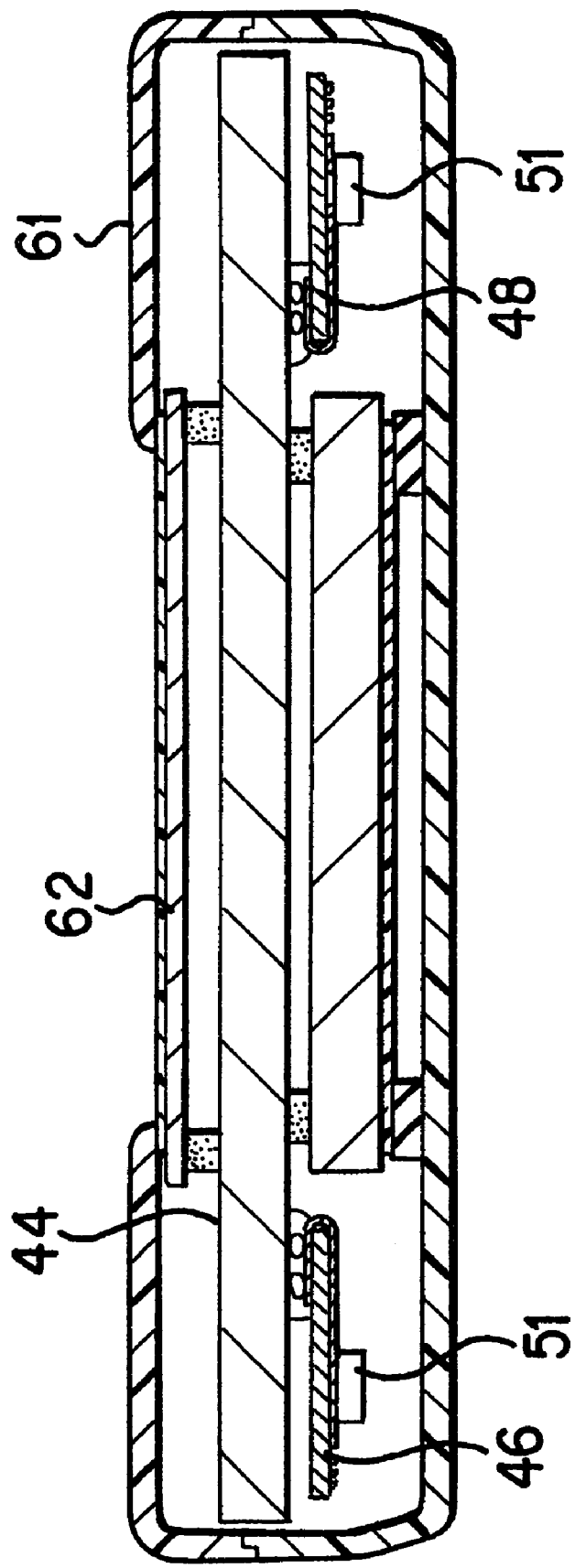
FIG. 19 is a cross-sectional view of the apparatus shown in FIG. 18.

FIG. 18 and FIG. 19 show an electronic apparatus 61 that contains the input/output device described above (the liquid crystal display device of the present invention) into which a touch panel 62, as an input device, is integrated. The electronic apparatus 61 is used, for example, as a terminal for an information network or as a portable computer. As shown in FIG. 19, the touch panel 62 is mounted on the liquid crystal display device 44 which connects to circuit boards 46, 48 that are the printed wiring boards of the present invention on which the liquid crystal semiconductor chips 51 are mounted.

As shown in FIG. 18, when a character 65 (or a symbol or a figure) is drawn on an input/output screen 63 using an input pen 64, a display character 66 is presented on screen. When a symbol or a figure, called an "icon", presented on screen is touched with the input pen 64 or a person's finger, the process responsive to that input is executed. In this embodiment as well, the liquid crystal display device has a miniature, light-weight and flat construction, with a narrowed periphery portion and, accordingly, a widened screen area for a better visibility. The electronic apparatus 61 thus makes a compact apparatus through a miniature, light-weight and flat configuration and is easy to operate. It also offers a larger quantity of on-screen information and, thus, presents high-performancing and multi-functional features.

Figure 20:
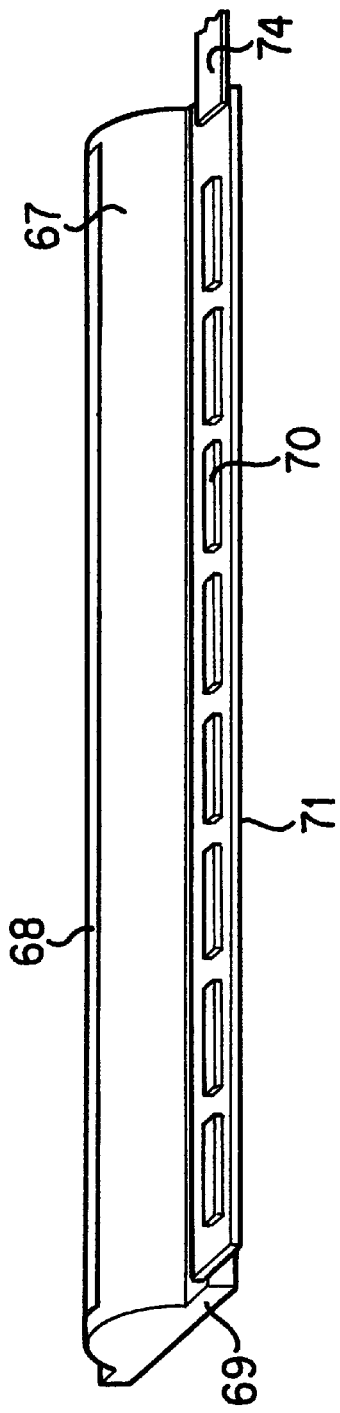
FIG. 20 is a perspective view showing a thermal printer head into which the present invention is embodied.
Figure 21:
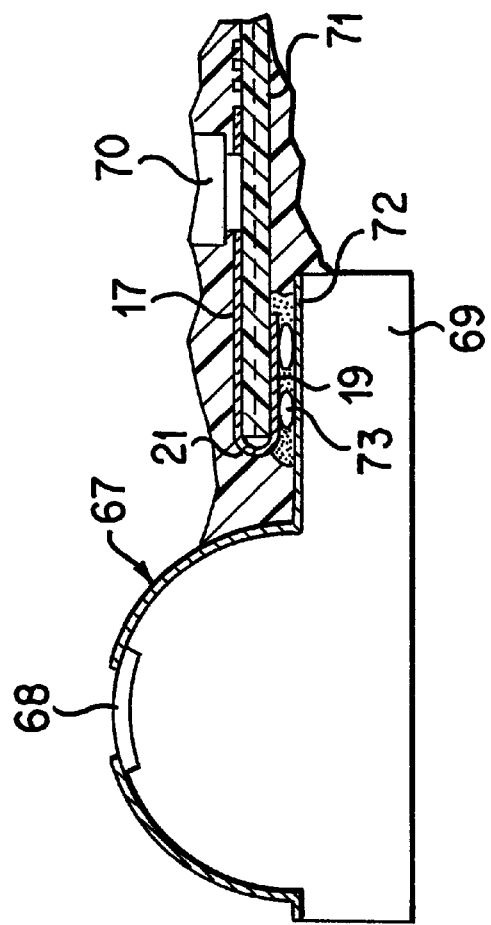
FIG. 21 is an enlarged cross-sectional view of a major portion of the thermal print head shown in FIG. 20.

FIG. 20 and FIG. 21 show a thermal printer head 67 for use in an electronic printer apparatus into which the present invention is embodied. In the thermal head 67, a circuit board 71, on which a driving semiconductor chip 70 is mounted in a manner commonly known in the art, is connected by an anisotropic conductive film 73 to a ceramic substrate 69 that constitutes a heater block 68. Like the circuit board in the first embodiment of the liquid crystal display device described above, the circuit board 71 is electrically and mechanically connected to a terminal 72 formed on the substrate 69 of the thermal printer head 67 by means of thermo-compression bonding of the anisotropic conductive film 73. Naturally, the circuit board 71 may be equally connected using another method among a variety of prior art methods. The other end of circuit board 71 is connected, for example, via the anisotropic conductive film to a cable 74 that is, in turn, connected to an external apparatus or a main unit side of the electronic printer apparatus.

According to the above embodiment, by employing the above-described circuit board, the circuit surface area required for driving the thermal printer head 67 is reduced, and the miniature, light-weight and flat design of the thermal printer head is promoted. Since the manufacturing cost for the circuit board is reduced and the number of joints with the thermal printer head and the joints between the circuit boards is reduced, the cost required for mounting the head and circuit boards and the manufacturing cost for the thermal printer head and the electronic printer apparatus on which the thermal printer head is installed are reduced.

Figure 22:
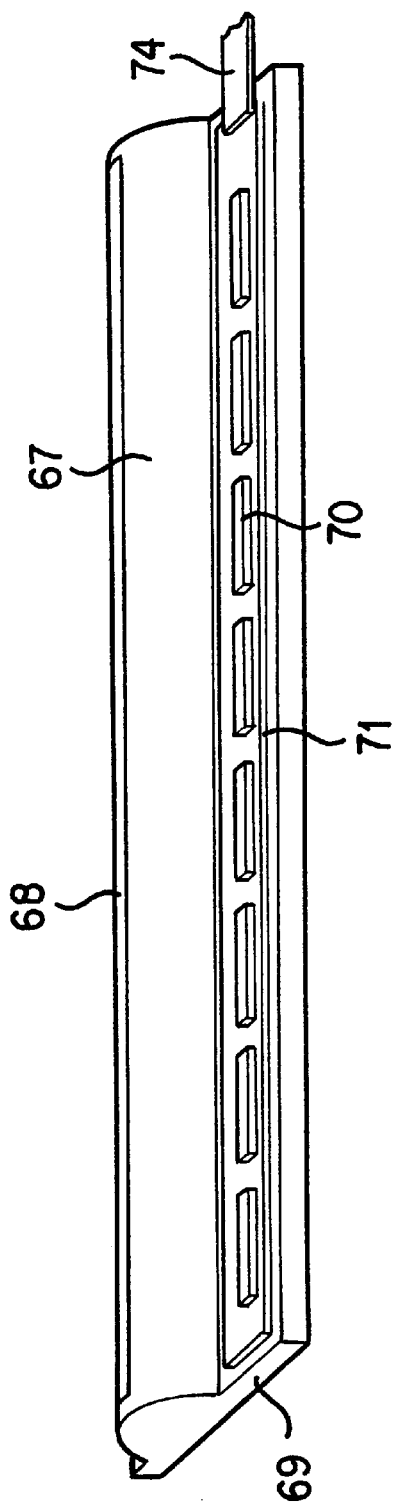
FIG. 22 is a perspective view showing a second embodiment of the thermal printer head.
Figure 23:
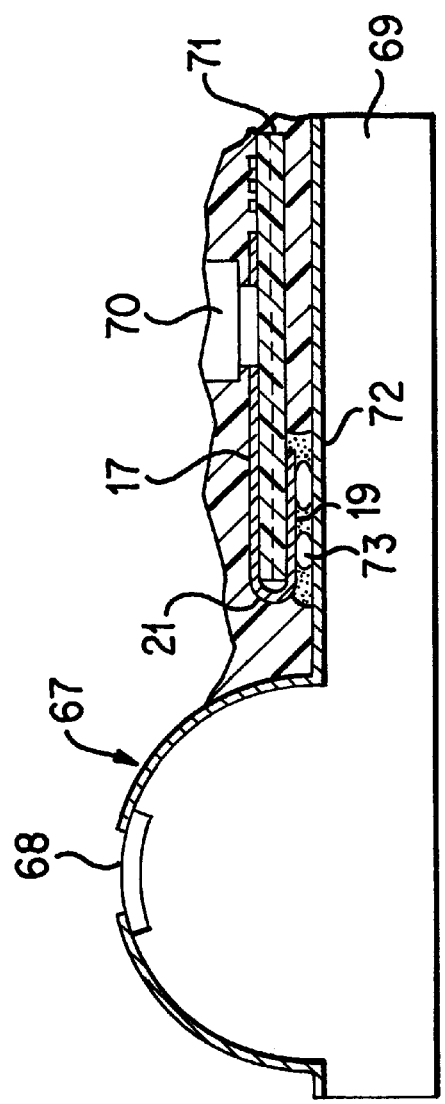
FIG. 23 is an enlarged cross-sectional view of a major portion of the thermal print head shown in FIG. 22.

FIG. 22 and FIG. 23 show an alternate example of the above-described thermal printer head. This alternate embodiment is different from the first embodiment of the thermal printer head in that the substrate 69 of the thermal printer head 67 is enlarged so that the entire circuit board 71 lies in the plane of the substrate 69. According to this embodiment, in addition to the advantage of the first embodiment, the circuit board 71 is integrated on its entire surface area with the substrate 69, and is thus reinforced against vibrations and shocks of the thermal printer head 67. Thus, a highly reliable thermal printer head 67 results.

Figure 24:
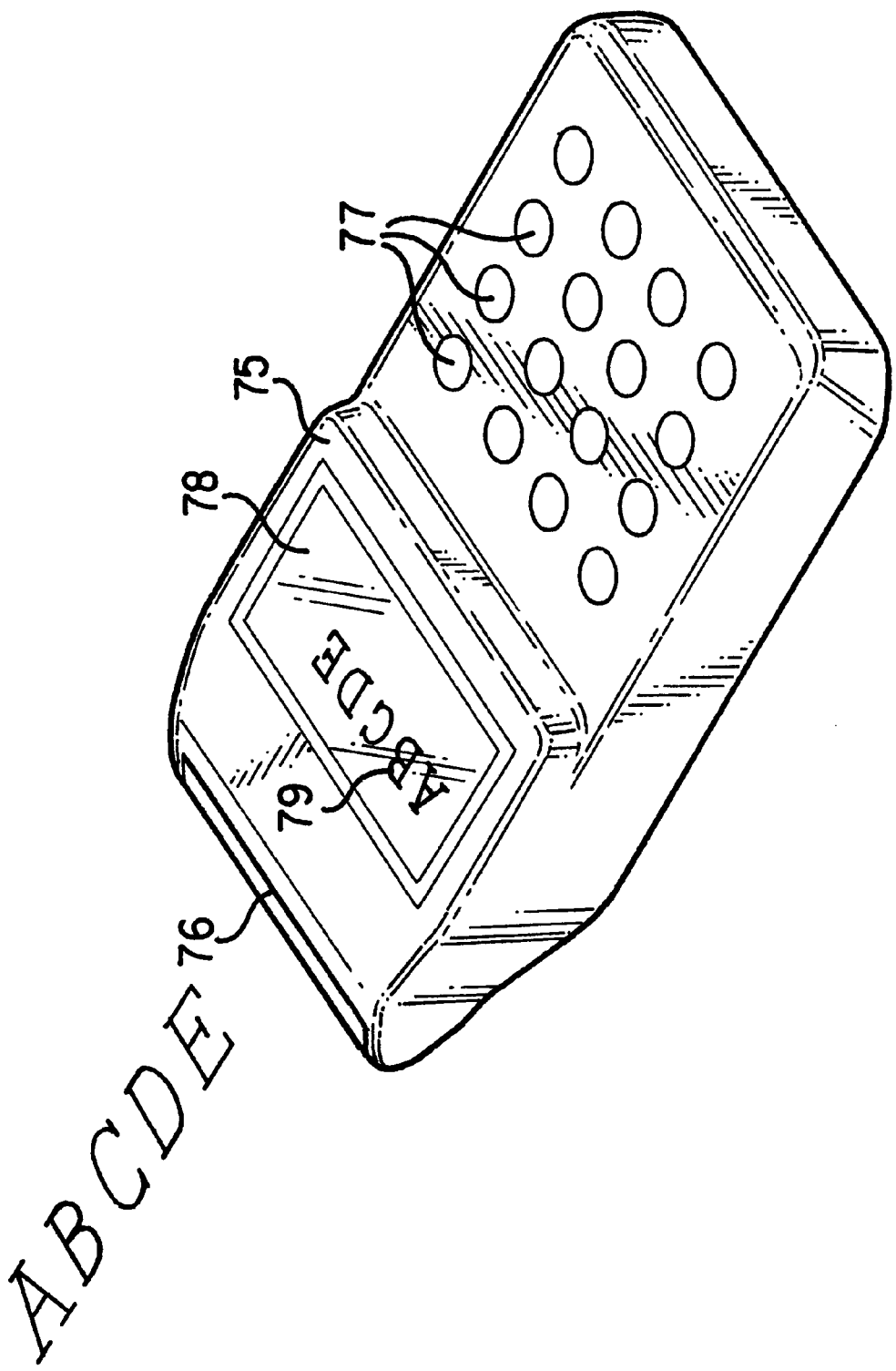
FIG. 24 is a perspective view showing an electronic printer apparatus into which the present invention is embodied.
Figure 25:
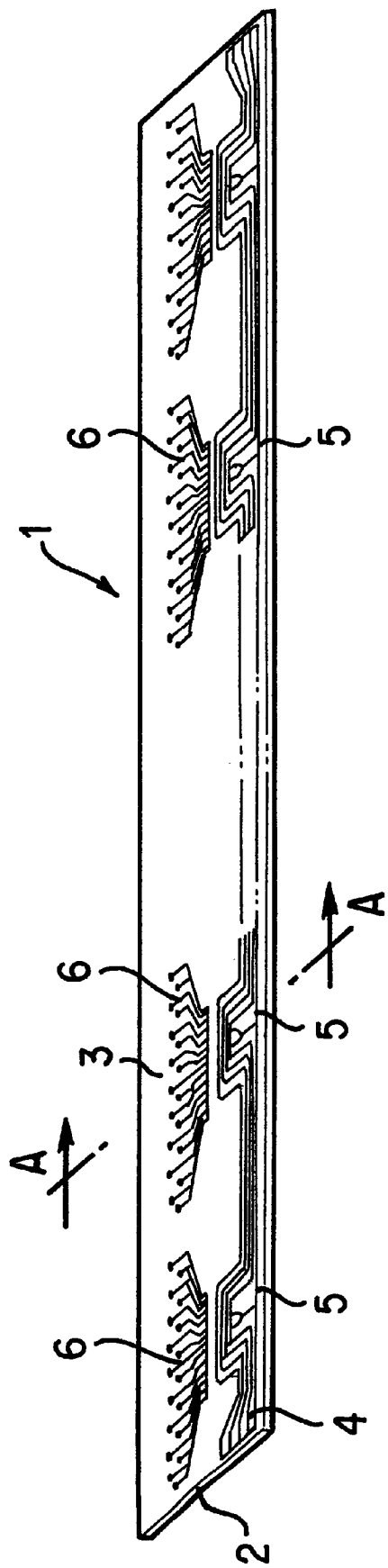
FIG. 25 is a perspective view showing a printed wiring board of the prior art.
Figure 26:
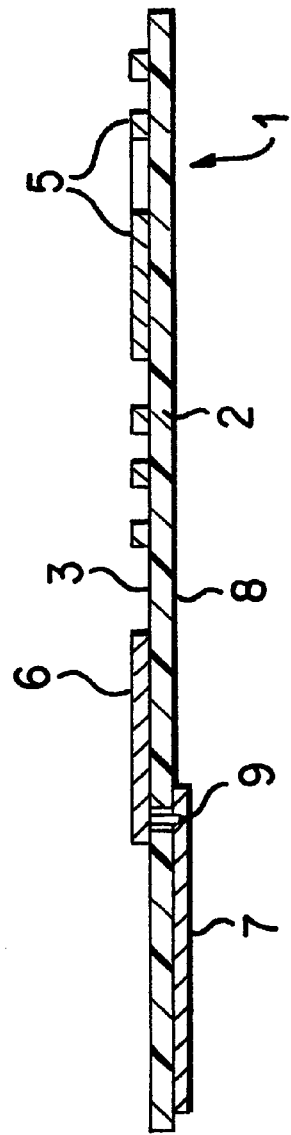
FIG. 26 is a cross-sectional view of the printed wiring board of FIG. 25.

A portable electronic printer apparatus 75 as shown in FIG. 24 contains the thermal printer head of the present invention. The portable electronic printer apparatus 75 is compact enough to be operated in a palm of a single hand and has on its forward end a printer block 76 in which a thermal printer head is built in. When characters or symbols are entered via input keys 77, the characters and/or symbols are presented on a liquid crystal display screen 78. When the printer block 76 is moved on the surface of a sheet of paper or other printing medium on which a printout is desired, displayed characters 79 or symbols are printed there. Not only characters or symbols but also figures, bar codes or the like are printable and, furthermore, information coming in through a radio link or a communications cable from external equipment may be input to the apparatus to be printed. The apparatus is particularly handy to attach notes such as bar codes, advertisements for selling points, and explanations to items arranged in a showcase such as in a store.

In such an electronic printer apparatus, by employing a low-cost and compact thermal printer head of a miniature, light-weight and flat design, a compact and low-cost host apparatus results. In particular, when the thermal printer head of the second embodiment described above is used, an electronic printer apparatus relatively insensitive to vibration and shock is obtained. By employing the above-described liquid crystal display device of the present invention for the liquid crystal display screen 78, an even more miniature, light-weight, flat and low-cost electronic printer apparatus results.

The present invention is not limited to the above described embodiments, and it will be apparent to those skilled in the art that a diversity of variations and modifications of the preceding embodiments can be carried out without departing from the technical scope and inventive concepts defined by the claims.

What is claimed is:

1. A multi-layered printed wiring board, comprising:
   a pair of outer layer boards made of insulating material;
   a single inner layer board or multiple inner layer boards made of insulating material sandwiched between the outer layer boards; and
   at least one conductor pattern formed between neighboring ones of outer layer boards and inner layer boards, whereby one of the outer layer boards has a first portion that is attached onto a neighboring inner layer and a second portion that is folded along a fold back over the other outer layer board, and said one of the outer layer boards having a cutout portion that is formed by partially cutting out the insulating material along the fold, so that said conductor pattern is formed on top of said one of the outer layer boards, said conductor pattern extending continuously across the fold at the cutout portion between the first portion and the second portion.

2. An electronic apparatus, comprising:

a printed wiring board that includes an insulating board having a first portion and a second portion identical in dimensions and shape and having a entirely substantially constant thickness over the insulating board, the insulating board being folded at a fold between said first portion and said second portion and stacked together, whereby the insulating board includes a cutout portion that is formed by partially cutting out the insulating board along the fold and a conductor pattern that extends continuously across the fold at the cutout portion between and onto the first portion and the second portion on a surface of the insulating board, and a liquid crystal display device that is constructed by connecting to a liquid crystal panel a circuit board that is the printed wiring board on which a liquid crystal driving semiconductor chip having an output side is mounted, the output side being connected to the conductor pattern and a part of the conductor pattern on the second portion being mechanically and electrically connected to a panel side terminal.

3. The electronic apparatus according to claim 2, further comprising a touch panel as an input device that is integrated with the liquid crystal display device.

* * * * *